United States Patent [19]

O'Connor et al.

[11] Patent Number: 5,208,462

[45] Date of Patent: May 4, 1993

[54] WIDE BANDWIDTH SOLID STATE OPTICAL SOURCE

[75] Inventors: James M. O'Connor, Ellicott City; Olaleye A. Aina, Columbia, both of Md.

[73] Assignee: Allied-Signal Inc., Morris Township, Morris County, N.J.

[21] Appl. No.: 810,583

[22] Filed: Dec. 19, 1991

[51] Int. Cl.$^5$ .................... G21G 4/00; H01L 31/12
[52] U.S. Cl. .................... 250/493.1; 250/504 R; 257/98
[58] Field of Search ......... 250/493.1, 504 R, 484.1 R; 357/17

[56] References Cited

U.S. PATENT DOCUMENTS

| | | | |
|---|---|---|---|
| 3,510,732 | 5/1970 | Amans | 357/17 |
| 3,529,200 | 9/1970 | Potter et al. | 357/17 |
| 3,593,055 | 7/1971 | Geusic et al. | 357/17 |
| 3,774,086 | 11/1973 | Vincent | 357/17 |
| 4,679,157 | 7/1987 | Hirano et al. | 374/159 |
| 4,857,228 | 8/1989 | Kabay et al. | 252/301.4 H |

OTHER PUBLICATIONS

Geusic et al., "Efficiency of Red, Green, and Blue Infrared-to-Visible Conversion Sources", Journal of Applied Physics, vol. 42, No. 5, pp. 1958–1960, Apr. 1971.

*Primary Examiner*—Bruce C. Anderson
*Attorney, Agent, or Firm*—Howard G. Massung

[57] ABSTRACT

A phosphor is placed on a light emitting surface of a solid state optical source. The phosphor absorbs the narrow bandwidth light from the optical source, and emits light that has a wide bandwidth. A lens is used to collect and focus the wide bandwidth light.

8 Claims, 3 Drawing Sheets

WIDE BANDWIDTH SOLID STATE OPTICAL SOURCE

BACKGROUND OF THE INVENTION

1. Field of the Invention

The present invention relates to solid state optical sources, more specifically it relates to solid state optical sources with a wide bandwidth.

2. Description of the Related Art

Solid state optical sources are used in communications involving fiber optics. The number of channels carried by a fiber is increased through wavelength multiplexing. Wavelength multiplexing requires the use of a wide bandwidth optical source.

Typical solid state optical sources have a full width at half maximum (FWHM) bandwidth of 100 nm or less. A band width of 100 nm or less is insufficient for adequate wavelength multiplexing. One possible solution is to combine several solid state optical sources having slightly different wavelengths to achieve the desired bandwidth. Arranging several solid state optical sources so that they interface to a small diameter optical fiber is cumbersome and is unreliable. Another possible solution is to use a white light source, such as a lamp, in combination with a notched filter. This solution suffers from the disadvantages of size, weight and high power consumption.

SUMMARY OF THE INVENTION

The wide bandwidth solid state optical source comprises a solid state optical source that has a light emitting surface which emits a first light having a first FWHM bandwidth. A phosphor is positioned near the light emitting surface so that the phosphor absorbs the first light and emits a second light which has a second FWHM bandwidth that is greater than the first FWHM bandwidth. A typical phosphor can contain a material selected from the group consisting of CaS and SrS. The material can be doped with Yb.

The present invention provides a wide bandwidth solid state optical source without requiring a cumbersome arrangement of multiple solid state optical sources. In addition, the present invention does not require using a white light in combination with a notched filter. The present invention provides a wide band optical source by placing a phosphor coating on a solid state optical source such as an LED or laser diode. The phosphor coating absorbs the light produced by the optical source and reemits the energy as wide bandwidth optical energy.

DESCRIPTION OF THE PREFERRED EMBODIMENTS

Figure 1:
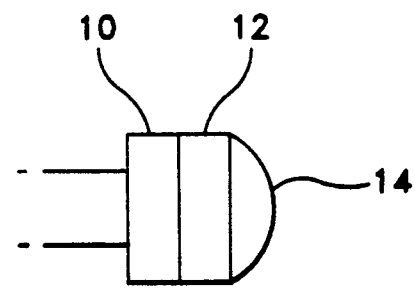
FIG. 1 illustrate a solid state optical source with a phosphor coating and a lens.

FIG. 1 illustrates solid state optical source 10 with phosphor coating 12. Phosphor coating 12 is positioned on or near a light emitting surface of optical source 10. Lens 14 is positioned on top of or near phosphor coating 12 so that it can capture light emitted by the coating. Solid state optical source 10 can be a Light Emitting Diode (LED) or laser diode. Diodes such as InGaAs diodes or GaAs diodes may be used. The light emitted by optical source 10 is absorbed by phosphor coating 12 and is then readmitted as a wider bandwidth light which is collected and focused by lens 14. Lens 14 can be used to interface to an optical fiber or to a filter that facilitates wavelength multiplexing.

Figure 2:
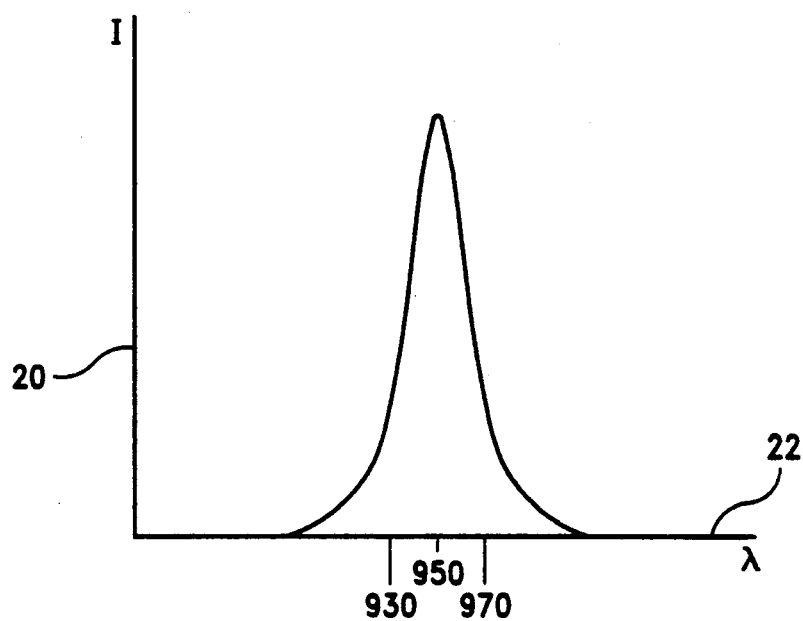
FIG. 2 illustrates the narrow bandwidth of a solid state optical source without a phosphor coating.

FIG. 2 illustrates the narrow bandwidth of a solid state optical source that does not have a phosphor coating. Axis 20 indicates the relative intensity of the light and axis 22 indicates the wavelength of the light in nanometers. The figure illustrates a typical GaAs diode with a center wavelength of approximately 950 nm and a FWHM band width of approximately 40 nm.

Figure 3:
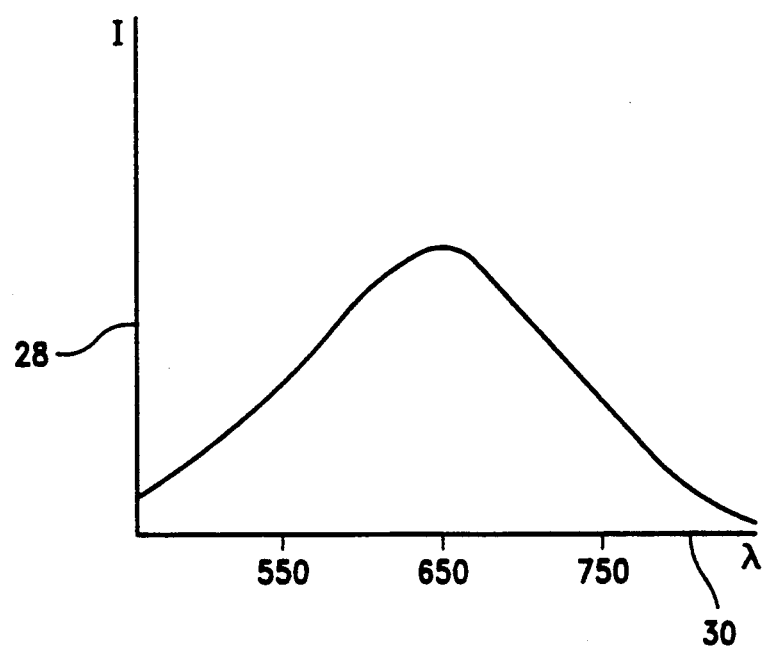
FIG. 3 illustrates the wider bandwidth of a solid state optical source with a phosphor coating.

FIG. 3 illustrates the bandwidth of a solid state optical source with a phosphor coating. Axis 28 illustrates the relative intensity of the light and axis 30 illustrates wavelength in nanometers. The curve shows that the light emitted by the phosphor coating has a bandwidth of approximately 200 nm. It should be noted that the bandwidth has been increased at the expense of decreasing the maximum relative intensity.

Solid state optical source 10 can be driven in any convenient manner. It can be driven with a DC signal or with a pulsed signal. In the case of a pulsed signal, the repetition cycle should have an undriven period that provides sufficient time for the phosphor coating to reduce its emissions.

Phosphor coating 12 can be of any type that is sensitive to the light emitted by the solid state optical source. Phosphor coating 12 should have an emission curve with a desirable center line wavelength and sufficient FWHM bandwidth for the particular application. It is preferable to use a phosphor of calcium sulfate (CaS) which has been doped with ytterbium (Yb) or a phosphor of strontium sulfate (SrS) which has also been doped with Yb.

Figure 4:
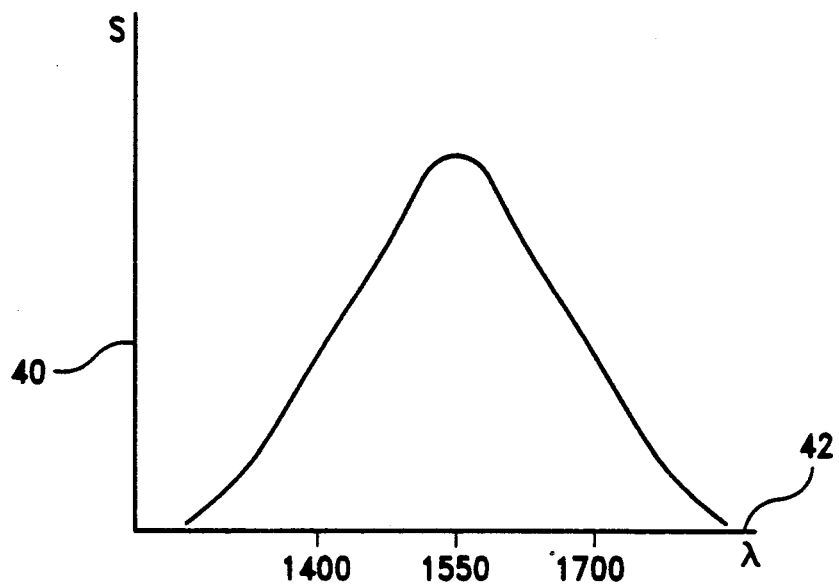
FIG. 4 is an example of a sensitivity curve for a phosphor coating.

FIG. 4 illustrate a sensitivity curve which is desirable for a phosphor matched to the output of an InGaAs diode. Axis 40 indicates relative sensitivity and axis 42 illustrates wavelength in nanometers. In this example, it should be noted that the center wavelength is positioned near 1550 nm which is the wavelength emitted by the InGaAs diode.

Figure 5:
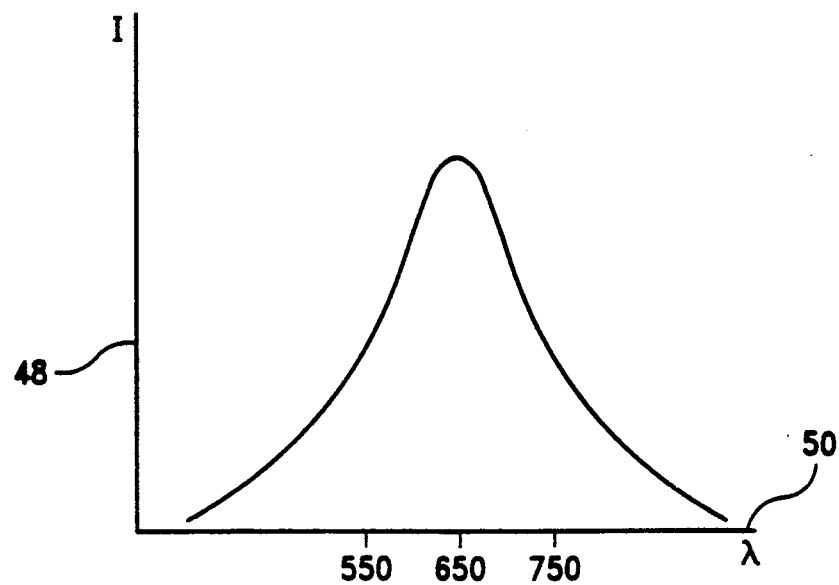
FIG. 5 is an example of an emission curve for a phosphor coating.

FIG. 5 illustrates a desirable emission curve. Axis 48 illustrates relative intensity and axis 50 illustrates wavelength in nanometers. It should be noted that the center wavelength of the emission curve is at approximately 650 nm and that the FWHM bandwidth is approximately 200 nm. It is also desirable to use phosphors having an emission curve with a center wavelength that is between approximately 600 nm and approximately 900 nm with a FWHM bandwidth that is between 100 nm and approximately 200 nm. A phosphor having characteristics similar to those shown in FIGS. 4 and 5, or another type of phosphor with a sensitivity curve and emission curve for a particular application can be obtained from Quantex which is located at 2 Research Court, Rockville, Md. 20850 (410 258-2701).

The phosphor is typically in the form of a chalk like substance. This substance can be sliced into a thin slice and than glued to the surface of solid state optical source 10. It is also possible to grind the phosphor to a powder which is mixed with an epoxy and then applied to the light emitting surface of solid state optical source 10. In either case, the thickness of phosphor coating 12 should be sufficiently thick that it captures most of the energy emitted by the optical source while not being so thick that it blocks an unacceptable amount of the optical energy that is reemited. A typical thickness is on the order of 0.05 cm.

When the phosphor is ground and mixed with an epoxy, the epoxy should be chosen such that it is nearly transparent to the wavelength emitted by both the solid state optical source and the phosphor. It is preferable to use a Kurt Lesker model KL-320K epoxy or a Devcon two part epoxy.

We claim:

1. A wide bandwidth solid state optical source, comprising:
   (a) a solid state optical source having a light emitting surface which emits a first light having a first FWHM bandwidth;
   (b) a phosphor positioned near said light emitting surface so that said phosphor absorbs said first light and emits a second light having a second FWHM bandwidth, said phosphor containing a material selected from the group consisting of CaS and SrS, said material being doped with Yb and said second FWHM bandwidth being greater than said first FWHM bandwidth;
   said phosphor being in a powder form and mixed with an epoxy which is nearly transparent to the wavelength emitted by both the solid state optical source and the phosphor; and
   a lens positioned to capture said second light.

2. The wide bandwidth solid state optical source of claim 1, wherein said solid state optical source is a LED.

3. The wide bandwidth solid state optical source of claim 1, wherein said solid state optical source is a laser diode.

4. The wide bandwidth solid state optical source of claim 1, wherein said solid state optical source is a GaAs diode.

5. The wide bandwidth solid state optical source of claim 1, wherein said solid state optical source is a InGaAs diode.

6. The wide bandwidth solid state optical source of claim 1, wherein said second light has a center wavelength between approximately 600 nm and approximately 900 nm.

7. The wide bandwidth solid state optical source of claim 1, wherein said second light has a FWHM bandwidth greater than 100 nm.

8. A wide bandwidth solid state optical source, comprising:
   (a) a solid state optical source having a light emitting surface which emits a first light having a first FWHM bandwidth;
   (b) a phosphor positioned near said light emitting surface so that said phosphor absorbs said first light and emits a second light having a center wavelength between approximately 600 nm and approximately 900 nm and having a second FWHM bandwidth being greater than said first FWHM bandwidth and being between 100 nm and approximately 200 nm, said phosphor being in powder form and mixed with an epoxy which is nearly transparent to the wavelength emitted by both the solid state optical source and the phosphor, and containing a material selected from the group consisting of CaS and SrS, said material being doped with Yb; and
   (c) a lens positioned to capture said second light.

* * * * *